(12) United States Patent
Hashimoto

(10) Patent No.: US 6,433,384 B1
(45) Date of Patent: Aug. 13, 2002

(54) SEMICONDUCTOR MEMORY DEVICE HAVING SOURCES CONNECTED TO SOURCE LINES

(75) Inventor: Hiroshi Hashimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/627,457

(22) Filed: Jul. 27, 2000

(30) Foreign Application Priority Data

Jul. 29, 1999 (JP) .................................. 11-215601

(51) Int. Cl.⁷ ............................................. H01L 29/788
(52) U.S. Cl. ...................... 257/316; 257/347; 257/763
(58) Field of Search ................................... 257/315, 316, 257/321, 347, 754, 763

(56) References Cited

U.S. PATENT DOCUMENTS 5,270,240 A  * 12/1993  Lee ............................ 257/321
6,044,016 A  *  3/2000  Itoh ........................... 257/316
6,069,383 A  *  5/2000  Yu ............................. 257/316

FOREIGN PATENT DOCUMENTS

| JP | 5-145047 | * | 6/1993 |
| JP | 8-106791 |   | 4/1996 |
| JP | 9-275197 |   | 10/1997 |
| JP | 2833030  |   | 10/1998 |

* cited by examiner

Primary Examiner—Chandra Chaudhari
(74) Attorney, Agent, or Firm—Armstrong, Westerman & Hattori, LLP

(57) ABSTRACT

A semiconductor memory device includes a silicon semiconductor substrate, a plurality of element isolation regions formed on the silicon semiconductor substrate, a plurality of semiconductor memory cells formed between the element isolation regions, and conductive films formed on the silicon semiconductor substrate and connecting to source diffusion regions of at least two of the semiconductor memory cells.

12 Claims, 14 Drawing Sheets

PRIOE ART

SEMICONDUCTOR MEMORY DEVICE HAVING SOURCES CONNECTED TO SOURCE LINES

CROSS-REFERENCE TO RELATED APPLICATIONS

This application is based upon and claims priority of Japanese Patent Application No. 11-215601 filed on Jul. 29, 1999, the contents being incorporated herein by reference.

BACKGROUND OF THE INVENTION

1. Field of the Invention

The present invention generally relates to semiconductor memory devices and methods for manufacturing the same, and more particularly to a semiconductor memory device including a plurality of semiconductor memory cells, sources of which are coupled to source lines, and a method for manufacturing such a semiconductor memory device.

1. Description of the Prior Art

FIG. 1 shows an array of NOR flash memory cells MC of a conventional non-volatile semiconductor memory device. It is indispensable for a method of manufacturing the non-volatile semiconductor memory device to scale down the NOR flash memory cells MC provided thereon.

As shown in FIG. 1, the NOR flash memory cells MC, which are transistors, are arrayed such that the transistors in each row have sources S coupled to a common source line SL and gates G coupled to a common word line WL parallel to the common source line SL. Also, the transistors in each column have drains $D_R$ coupled to a common bit line BL.

In addition, such a source line SL may be used to perform flash-erasing or the like.

FIG. 2 is a cross-sectional diagram showing a configuration of the conventional semiconductor memory device, taken along the source line SL of FIG. 1. In this diagram, reference numeral 1 denotes a silicon semiconductor substrate, 17 a CVD (Chemical Vapor Deposition) oxide film, 18 a BPSG (Boro-Phospho Silicate Glass) film, and 21 a field oxide film.

As shown in FIG. 2, in order to scale down the semiconductor memory cells MC provided on the semiconductor substrate 1, the source line SL is formed such that the field oxide film 21 is formed on the silicon semiconductor substrate 1 by means of a LOCOS (local oxidation of silicon) element isolation process and is etched by means of a SAS (Self-Aligned Source) process after the gates G are formed, and a continuous impurity diffusion region including source diffusion regions 12 of the semiconductor memory cells MC (transistors) is formed as the source line SL on the silicon semiconductor substrate 1.

Next, a description will be given below of a method of using the SAS process to manufacture the NOR flash memory cells MC, by referring to FIG. 3 through FIG. 7.

FIG. 3 is a plan view partly showing a configuration of the conventional semiconductor memory device including the NOR flash memory cells MC.

FIGS. 4A through 4D are diagrams partly showing a cross-sectional configuration of the conventional semiconductor memory device, taken along a word line WL A–A' in FIG. 3.

As shown in FIG. 4A, on the silicon semiconductor substrate 1, a pad oxide film 2 with a thickness of approximately 25 nm is formed by means of a thermal oxidation process, which may be performed at 900° C. for example.

On the pad oxide film 2, a silicon nitride film 3 with a thickness of approximately 170 nm is stacked by a Chemical Vapor Deposition (CVD) process. And then, by using lithography and etching techniques, the silicon nitride film 3 is patterned and etched so as to remain on element regions alone.

As shown in FIG. 4B, the silicon semiconductor substrate 1 is thermally oxidized at approximately 1100° C. by means of the silicon nitride film 3 serving as a mask, so that a LOCOS element isolation region 4 with a thickness of approximately 300 nm is formed.

As shown in FIG. 4C, the silicon nitride film 3 and the pad oxide film 2 are removed so that a tunnel insulation film 5 with a thickness of approximately 10 nm is formed on the silicon semiconductor substrate 1 by means of the thermal oxidation process, which may be performed at 900° C. for example. After that, a polysilicon film 6 with a thickness of approximately 100 nm is stacked as a floating gate on the tunnel insulation film 5 by means of the CVD process. And then, the polysilicon film 6 is patterned to form a striped pattern covering the element regions by means of the lithography and etching techniques.

As shown in FIG. 4D, an ONO film 7 for combining capacitance of the floating gate and a control gate may be formed such that an oxide film with a thickness of approximately 10 nm is formed by means of the CVD process, a silicon nitride film with a thickness of approximately 10 nm is stacked on the an oxide film, and an oxide film with a thickness of approximately 4 nm is further stacked on the silicon nitride film by means of the thermal oxidation process which may be performed at 950° C. for example.

After that, a polysilicon film 8 with a thickness of approximately 120 nm is formed as the control gate by means of the CVD process. On the polysilicon film 8, a WSi film 9 with a thickness of approximately 150 nm is stacked. And further on the WSi film 9, a polysilicon film 10 with a thickness of approximately 50 nm is stacked. Furthermore, on the polysilicon film 10, a silicon nitride oxide film 11 with a thickness of approximately 100 nm is stacked, serving as an anti-reflection film at the time of resist patterning.

FIGS. 5A through 5C are, on the other hand, diagrams partly showing a cross-sectional configuration of the conventional semiconductor memory device, taken along a bit line (aluminum wire) D–D' in FIG. 3.

As shown in FIG. 5A, resist in a pattern extending in a direction intersecting a pattern of the LOCOS element isolation region 4 shown in FIG. 3 is applied thereon (not shown), and by using the resist as a mask, the silicon nitride oxide film 11, the polysilicon film 10, the WSi film 9, and the polysilicon film 8 are etched in order.

Thereby, the word line WL connected to the control gate of the semiconductor memory cell MC is thus formed. After that, the ONO film 7 and the polysilicon film 6 are etched by using the silicon nitride oxide film 11 as a mask, and thereby a stacked gate electrode is formed.

Then, by performing a self-aligned ion implantation for the stacked gate, impurities are implanted into the silicon semiconductor substrate 1, and a thermal process is performed half an hour in a nitrogen atmosphere of, for example, approximately 900° C. Thereby, a source diffusion region 12 and a drain diffusion region 13 are formed. In addition, the above-mentioned ion implantation is performed such that, for example, $AS^+$ ions are accelerated with energy of 60 KeV and then are irradiated into he silicon semiconductor substrate 1 by a dose of $4 \times 10^{15}$ ions/cm$^2$.

As shown in FIG. 5B, a silicon oxide film 14 with a thickness of approximately 100 nm is stacked thereon by means of the CVD process and then is etched back. Thereby, the silicon oxide film 14 becomes a side wall spacer. After that, in order to expose the source diffusion region 12 by means of the lithography technique, the resist covering the drain diffusion region 13 is patterned and the LOCOS element isolation region 4 shown in FIG. 3 is etched.

Then, By implanting the $As^+$ ions, which have been accelerated with the energy of 60 KeV, thereinto by a dose of $4 \times 10^{15}$ ions/cm$^2$, and by performing the thermal process half an hour in the nitrogen atmosphere of, for example, 850° C., a continuous diffusion region connecting the source diffusion regions 12 of the semiconductor memory cells MC is formed as the source line SL.

As shown in FIG. 5C, the silicon oxide film 17 with a thickness of approximately 100 nm and the BPSG film 18 with a thickness of approximately 900 nm are stacked thereon by means of the CVD process. After that, a contact hole 19 is formed, and an aluminum wiring film is stacked on the BPSG film 18 by using a spattering process. Then, the aluminum wiring film is patterned into the bit line BL.

After the previously described steps are completed, metal wiring is carried out, which is the same as that of a common MOS integrated circuit, and a surface protecting insulation film is formed.

Accordingly, the semiconductor memory device is thus manufactured.

FIG. 6 is a cross-sectional diagram showing a configuration of the semiconductor memory device, taken along a line B–B' in FIG. 3.

As shown in this diagram, on the silicon semiconductor substrate 1, the LOCOS element isolation region 4 and the drain diffusion region 13 are formed, and the silicon oxide film 17 and the BPSG film 18 are stacked thereon. After that, the contact hole 19 is opened, and the aluminum wiring film is formed as the bit line BL.

FIG. 7 is a cross-sectional diagram showing a configuration of the semiconductor memory device, taken along a line E–E' in FIG. 3.

As shown in this diagram, the LOCOS element isolation region 4 and the source line SL are formed on the silicon semiconductor substrate 1. The polysilicon film 8, the WSi film 9, the polysilicon film 10, and the silicon nitride oxide film 11 are stacked on the LOCOS element isolation region 4 in order. And the silicon oxide film 14 is formed as the side wall spacer. Further, the silicon oxide film 17 and the BPSG film 18 are stacked thereon in order.

There is, however, a limitation in the LOCOS element isolation process in terms of scaling down the element isolation regions. In recent years, a trench element isolation process performed by etching a semiconductor semiconductor substrate has been become popular, which is required to be able to form elements the same as those formed by the LOCOS element isolation process.

FIG. 8A is a cross-sectional diagram along a line C–C' of FIG. 3, showing the source line SL of the NOR-type flash memory manufactured by the conventional manufacturing method that makes use of the trench element isolation process.

As shown in FIG. 8A, it is difficult for the trench element isolation process to form the source line SL. Specifically, in the case of employing the LOCOS element isolation process shown by FIG. 2, since parts 21 formed by etching element isolation regions on the silicon semiconductor substrate 1 have gently inclined surfaces, the source line SL can be easily formed by the ion implantation. On the other hand, in the case of employing the trench element isolation process, since parts Mt, which are formed by etching the element isolation regions on the silicon semiconductor substrate 1 by means of the SAS process, have sharp steps, the impurities cannot be effectively introduced into the steps by means of anisotropic ion implantation, and the source line SL cannot be formed.

As a result, the conventional manufacturing method cannot be used to manufacture the semiconductor memory device including the NOR-type flash memory cells in the case of employing the trench element isolation process.

FIG. 8B is a cross-sectional diagram showing a nonvolatile memory device formed by using the trench element isolation process, which is disclosed in Japanese Laid-open Patent Application No. 2-833030.

As shown in this diagram, a CVD tungsten layer is formed like a bridge built over n-type source diffusion regions of semiconductor memory cells. Since the element isolation regions and the n-type source diffusion regions are formed unevenly, there brings about a problem in that resistance of the CVD tungsten layer becomes high on the element isolation regions and the breaking thereof may occur in the most case.

As a result, it is difficult to form the source line SL with high-reliability and low-resistance by means of the above-mentioned prior art.

SUMMARY OF THE INVENTION

It is a general object of the present invention to provide a semiconductor memory device and a method for manufacturing the same, in which the above-mentioned problems can be eliminated.

Another and a more specific object of the present invention is to provide a semiconductor memory device with high density and a method for manufacturing the semiconductor memory device including a plurality of semiconductor memory cells, sources of which are connected to source lines.

The above object and other objects of the present invention are achieved by a semiconductor memory device including a semiconductor substrate, a plurality of memory cells arranged on the semiconductor substrate in an array which is made up of a plurality of rows and columns, each of the memory cells having a gate, a drain, and a source, a plurality of word lines, each coupled to gates of the memory cells in a corresponding row, a plurality of bit lines, each coupled to drains of the memory cells in a corresponding column, a plurality of isolation regions formed on the semiconductor substrate and isolating the memory cells, and a plurality of source lines, disposed approximately parallel to the word lines, and each coupled to sources of the memory cells in a corresponding row, wherein each of the source lines is made up of a conductive pattern formed on an approximately flat region of the semiconductor substrate.

The above object and other objects of the present invention are achieved by a method for manufacturing a semiconductor memory device which includes an isolation region formed on a semiconductor substrate, source and drain diffusion regions formed in the semiconductor substrate, a gate oxide film formed on the semiconductor substrate between the source and drain diffusion regions, a floating gate formed on the gate oxide film, and a control gate formed on the floating gate via a first insulation film, the method comprising the steps of forming an second insulation film on an exposed portion of the substrate not covered by the isolation region and etching the second insulation film to expose the source diffusion regions, and forming a conductor on the exposed source diffusion region.

Other objects, features and advantages of the present invention will become more apparent from the following detailed description when read in conjunction with the accompanying drawings.

DETAILED DESCRIPTION OF THE PREFERRED EMBODIMENTS

With reference to the drawings, a description will be given below of preferred embodiments of the present invention.

First, a description will be given of a semiconductor memory device according to a first embodiment of the present invention, by referring to FIG. 9.

Figure 1:
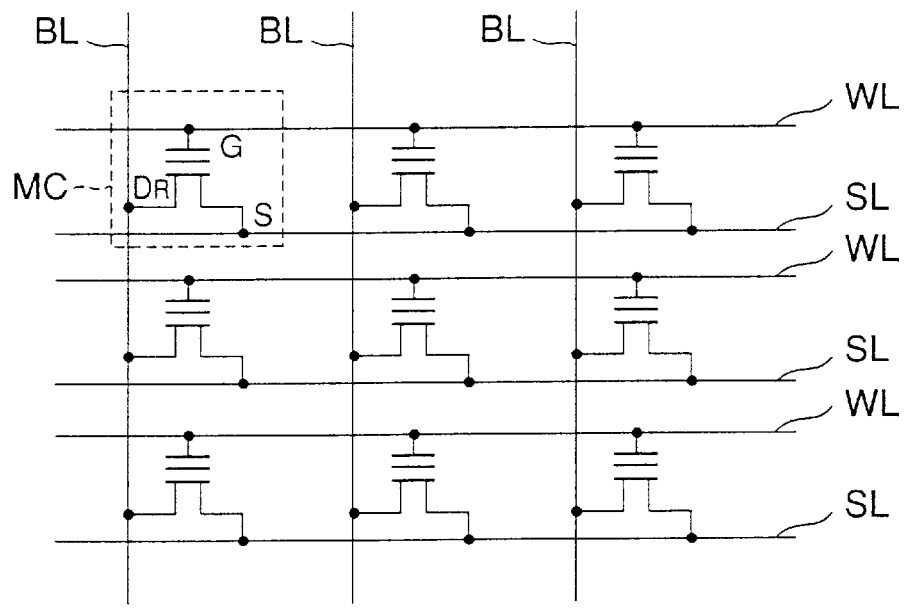
FIG. 1 is a diagram showing an array of NOR flash memory cells of a conventional non-volatile semiconductor memory device.
Figure 2:
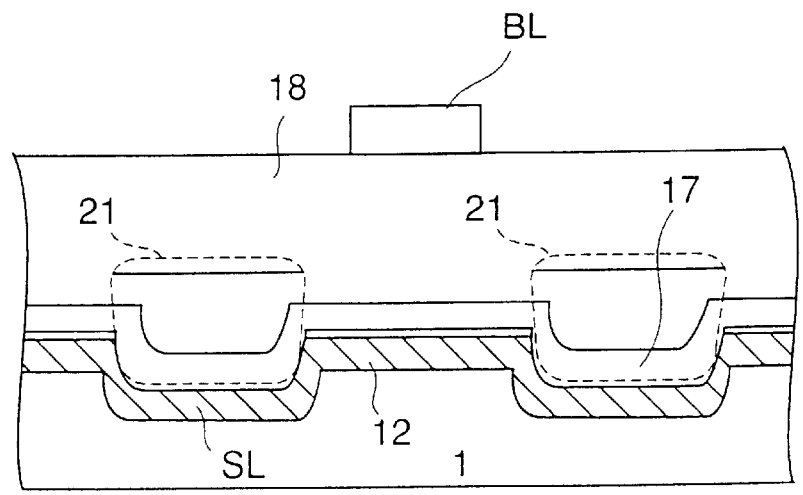
FIG. 2 is a cross-sectional diagram showing a configuration of the conventional semiconductor memory device, taken along a source line SL of FIG. 1.
Figure 3:
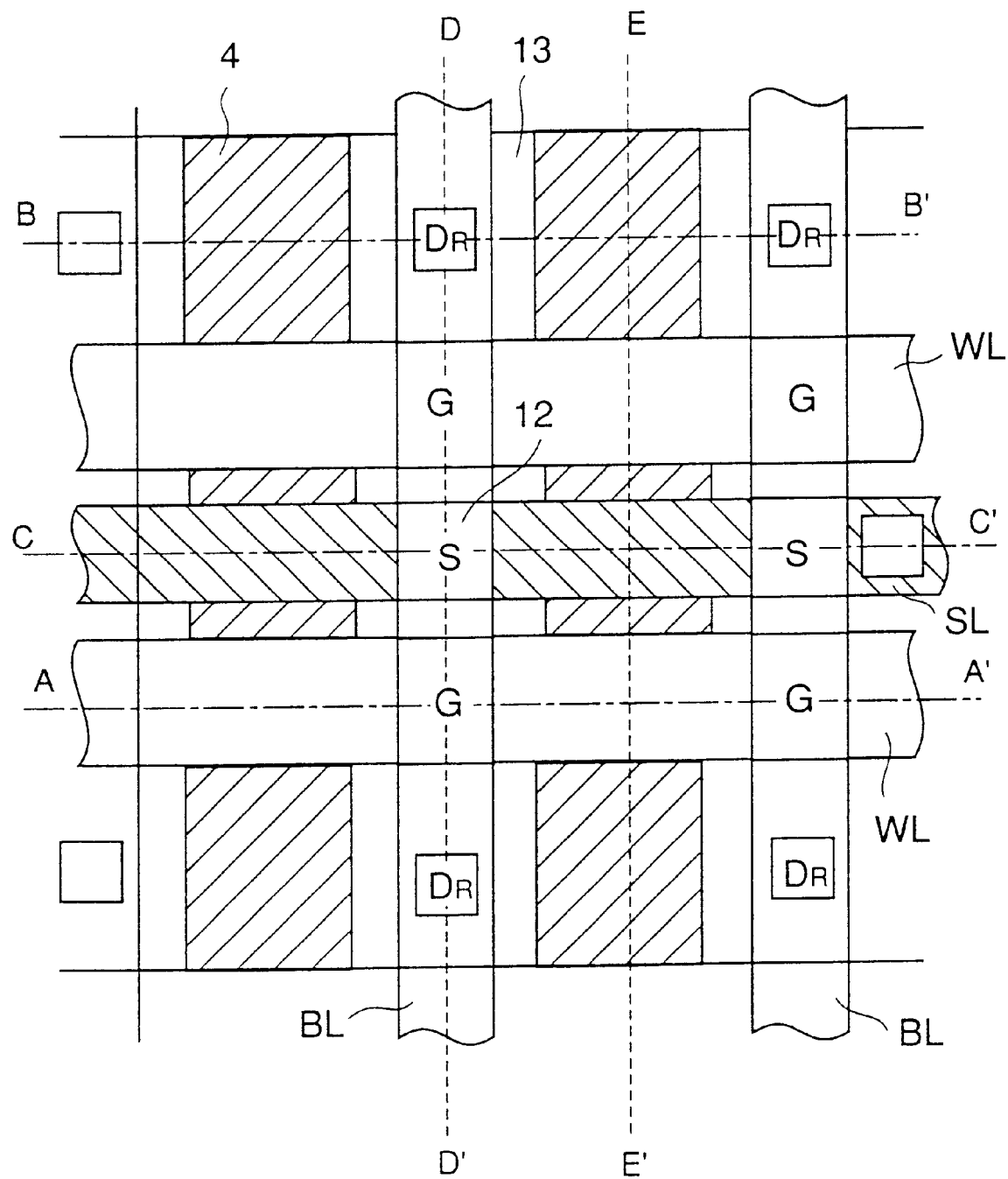
FIG. 3 is a plan view showing a configuration of the conventional semiconductor memory device having the NOR flash memory cells.
Figure 4A:
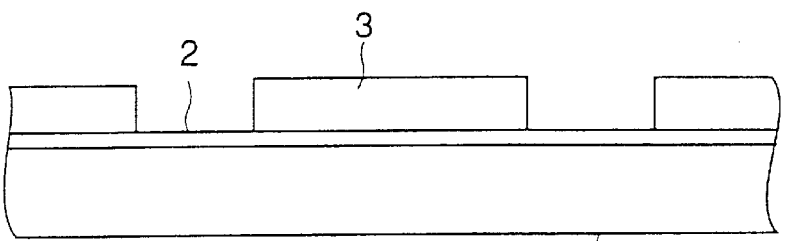
FIGS. 4A through 4D are diagrams partly showing a cross-sectional configuration of the conventional semiconductor memory device, taken along a line A–A' of FIG. 3.
Figure 4B:
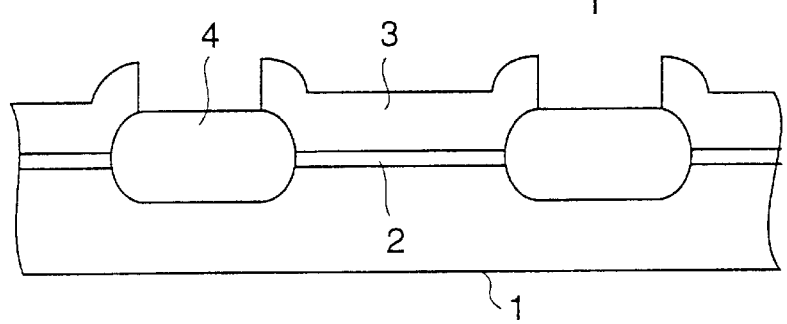
Figure 4C:
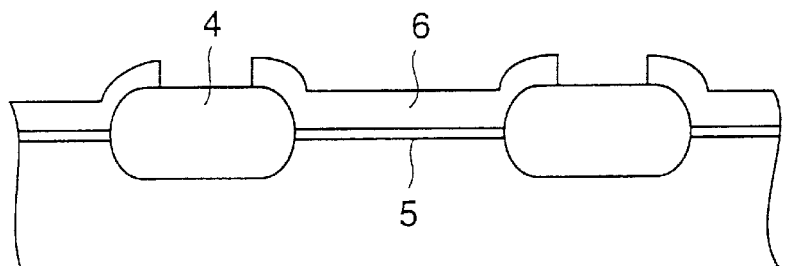
Figure 4D:
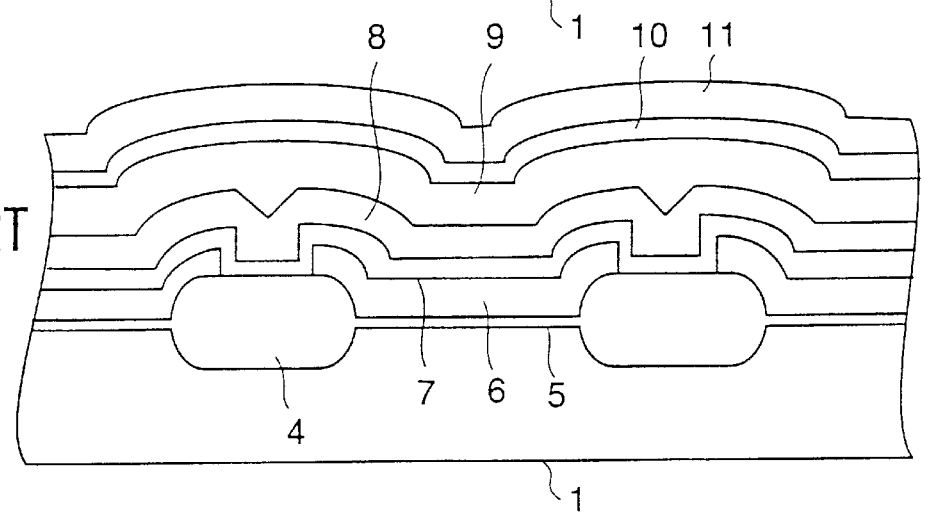
Figure 5A:
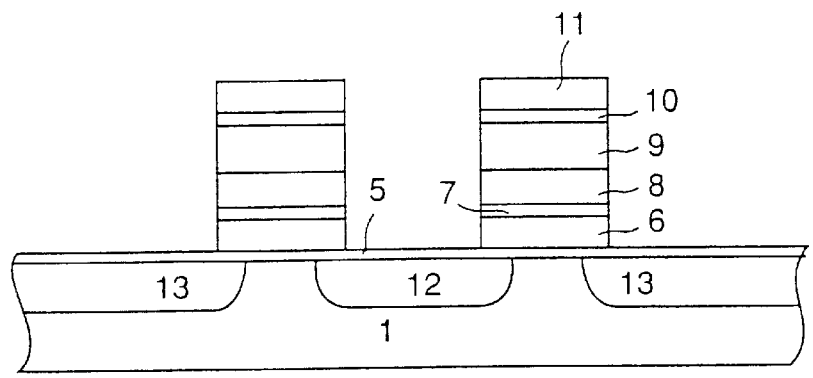
FIGS. 5A through 5C are diagrams partly showing a cross-sectional configuration of the conventional semiconductor memory device, taken along a line D–D' of FIG. 3.
Figure 5B:
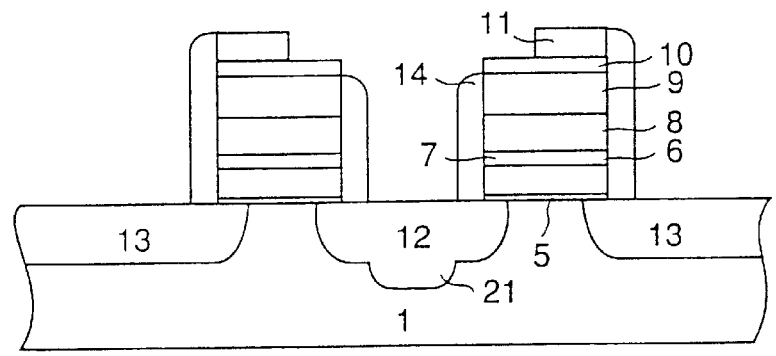
Figure 5C:
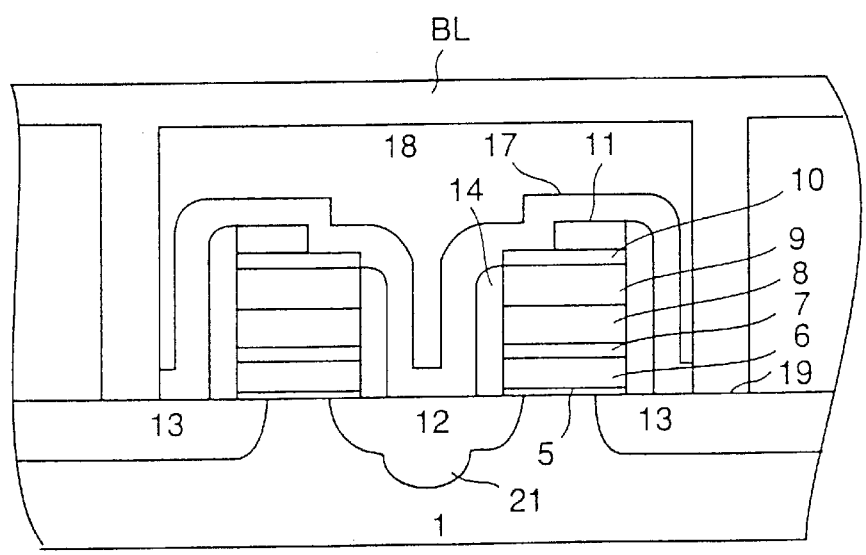
Figure 6:
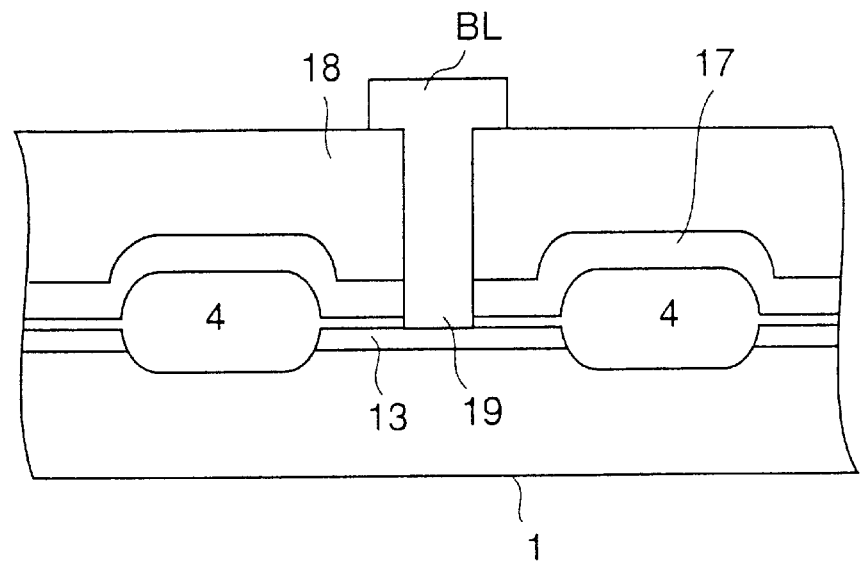
FIG. 6 is a diagram showing a cross-sectional configuration of the conventional semiconductor memory device, taken along a line B–B' of FIG. 3.
Figure 7:
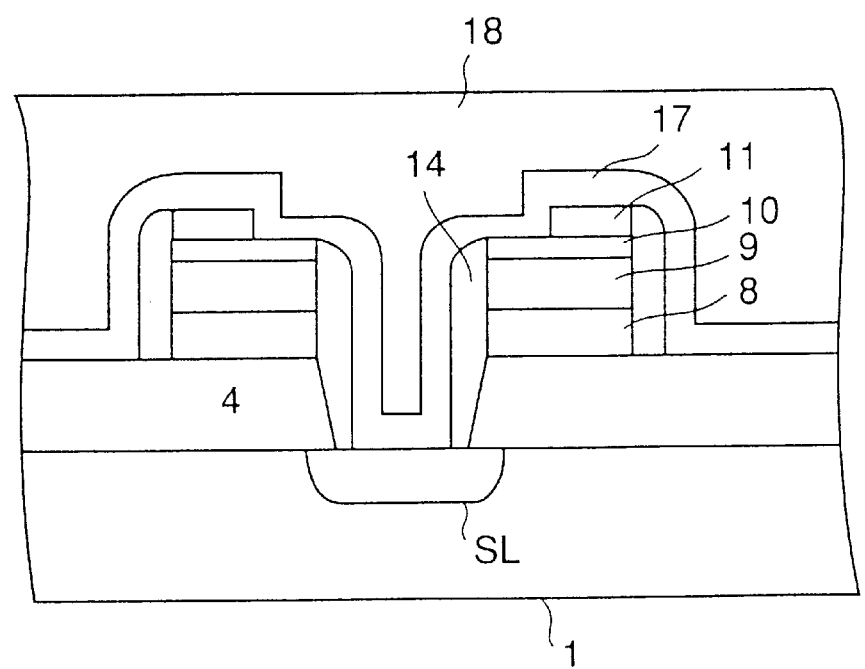
FIG. 7 is a diagram showing a cross-sectional configuration of the conventional semiconductor memory device, taken along a line E–E' of FIG. 3.
Figure 8A:
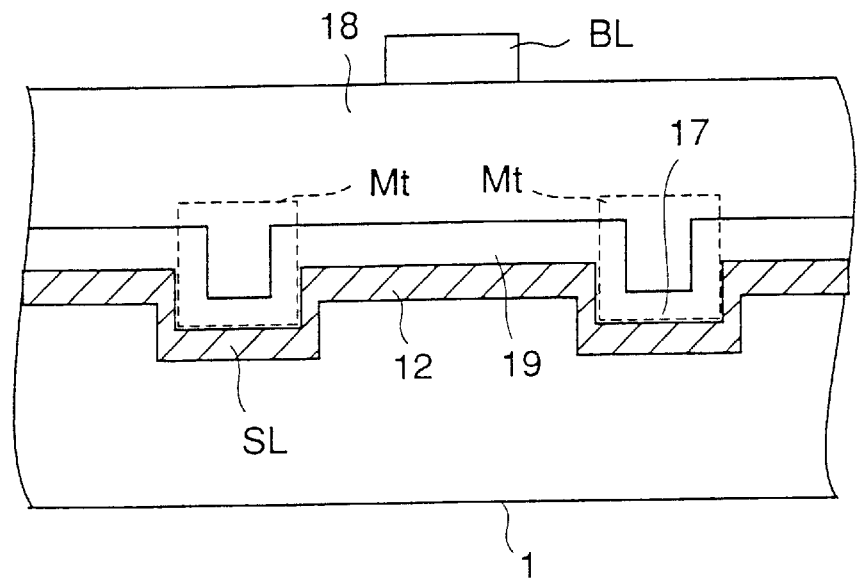
FIG. 8A is a cross-sectional diagram showing a source line of the NOR flash memory cells, which is formed by using a trench element isolation process and a conventional manufacturing method.
Figure 8B:
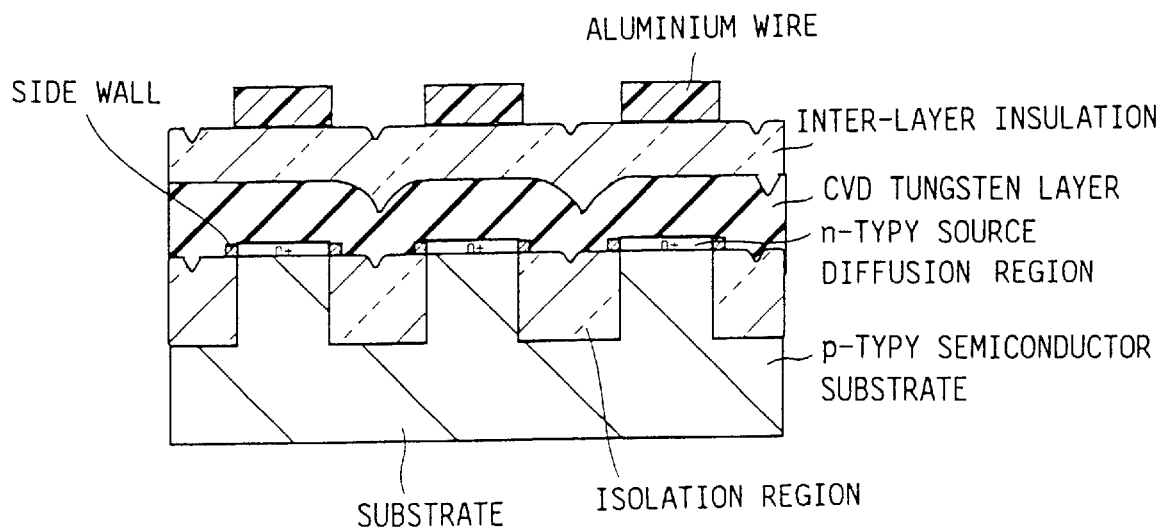
FIG. 8B is a cross-sectional diagram showing a semiconductor memory device disclosed in Japanese Laid-open Patent Application No. 2-833030.
Figure 9:
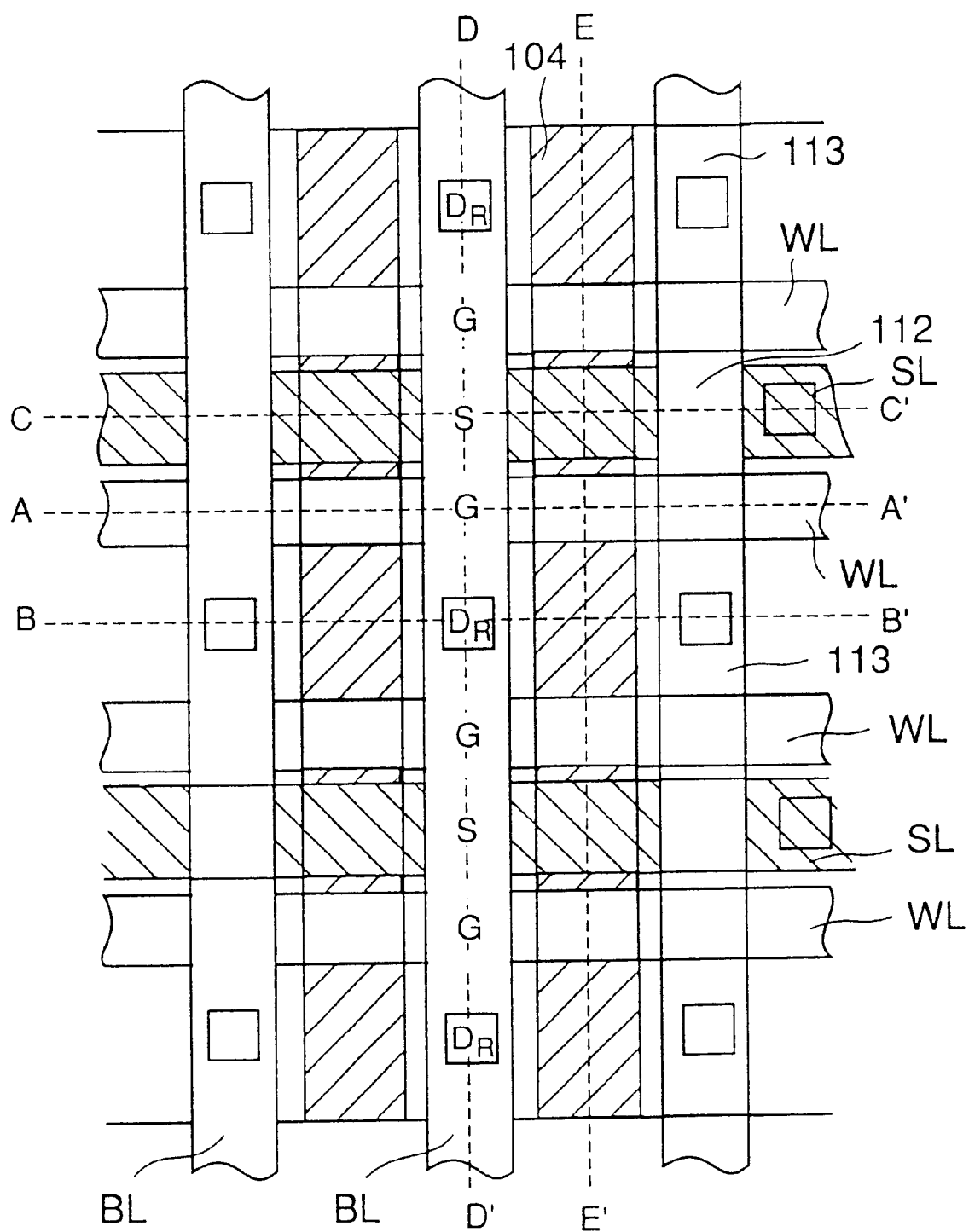
FIG. 9 is a plan view showing a configuration of a semiconductor memory device including NOR flash memory cells according to a first embodiment of the present invention.

FIG. 9 is a plan view showing a configuration of the semiconductor memory device of the first embodiment. As shown in this diagram, the semiconductor memory device includes a silicon semiconductor substrate 101 (not shown), on which a plurality of NOR flash memory cells, a plurality of trench element isolation regions 104, a plurality of bit lines BL, and a plurality of word lines WL are arranged.

The NOR flash memory cells are arranged on the silicon semiconductor substrate 101 in an array which is made up of a plurality of rows and columns, each of the memory cells having a gate G, a drain $D_R$ and source S.

Each of the word lines WL is coupled to gates G of the memory cells in a corresponding row. Each of the bit lines BL is coupled to drains $D_R$ of the memory cells in a corresponding column. The trench element isolation regions 104 formed on the semiconductor substrate 101 such that they are parallel with each other and in predetermined intervals, serving to isolate the memory cells. The source lines SL are disposed approximately parallel to the word lines WL and are each coupled to sources S of the memory cells in a corresponding row. Each of the source lines SL is made up of a conductive pattern formed on an approximately flat region of the semiconductor substrate.

Also, the bit lines BL are arranged in a direction in which the trench element isolation regions 104 are arranged. The word lines WL are arranged in a direction approximately vertical to the trench element isolation regions 104 and the bit lines BL.

FIGS. 10A through 10D are diagrams showing a cross-sectional configuration of the semiconductor memory device of the first embodiment, taken along a line A–A' of FIG. 9, the word line WL.

Figure 10A:
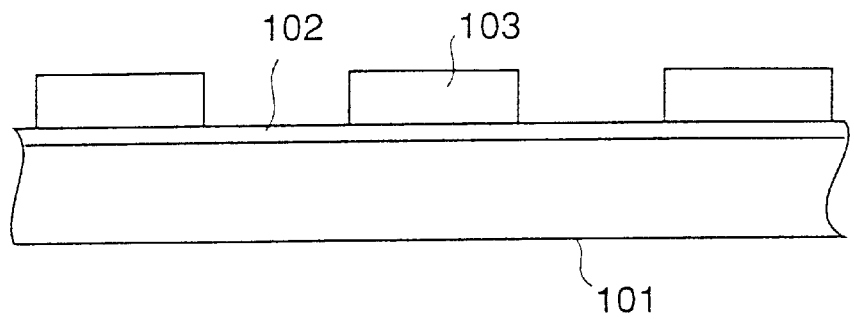
FIGS. 10A through 10D are diagrams showing a cross-sectional configuration of the semiconductor memory device of the first embodiment, taken along a line A–A' of FIG. 9.

As shown in FIG. 10A, on the silicon semiconductor substrate 101, a pad oxide film 102 with a thickness of approximately 25 nm is formed by means of a thermal oxidation process, which may be performed at 900° C. for example. On the pad oxide film 102, a silicon nitride film 103 with a thickness of approximately 170 nm is stacked by the Chemical Vapor Deposition (CVD) process. And then, by using the lithography and etching techniques, the silicon nitride film 103 is patterned and etched so as to remain on element regions alone.

Figure 10B:
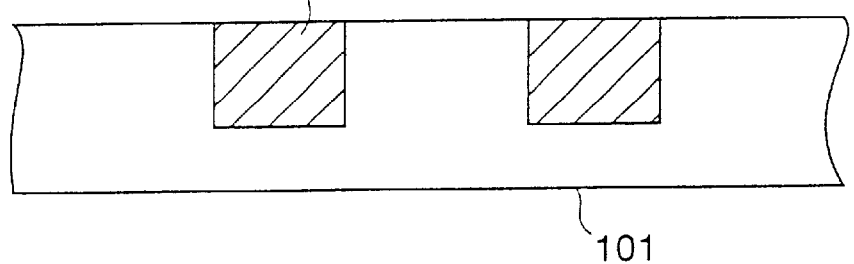

As shown in FIG. 10B, the silicon semiconductor substrate 101 is etched to form a plurality of trenches thereon each with a depth of approximately 400 nm by using the silicon nitride film 103 as a mask. The etched trenches are filled with an oxide film having a thickness of approximately 1000 nm by means of the CVD process. And then, the oxide film is buried into the etched trenches by employing a Chemical Mechanical Polish (CMP) process to polish a surface thereof, so that the trench element isolation regions 104 is formed. After that, the silicon nitride film 103 and the pad oxide film 102 are removed therefrom.

Figure 10C:
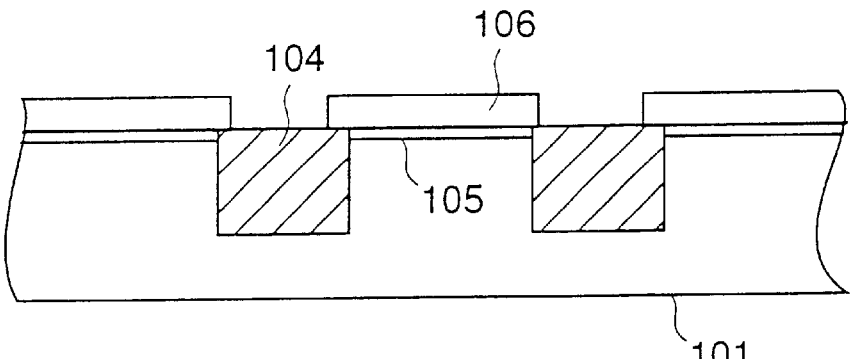

As shown in FIG. 10C, a tunnel insulation film 105 with a thickness of approximately 10 nm is formed on the silicon semiconductor substrate 101 by means of the thermal oxidation process. And then, a polysilicon film 106 with a thickness of approximately 100 nm is stacked as a floating gate on the tunnel insulation film 105 by means of the CVD process. After that, the polysilicon film 106 is doped with phosphorus until resistivity thereof reaches to approximately 300 Ω/cm. In addition, at this time, an amorphous silicon film, which is doped by phosphorus, may be used instead of the polysilicon film 106.

Next, by means of the lithography and etching techniques, the polysilicon film 106 is patterned into a stripped pattern for covering element forming regions.

Figure 10D:
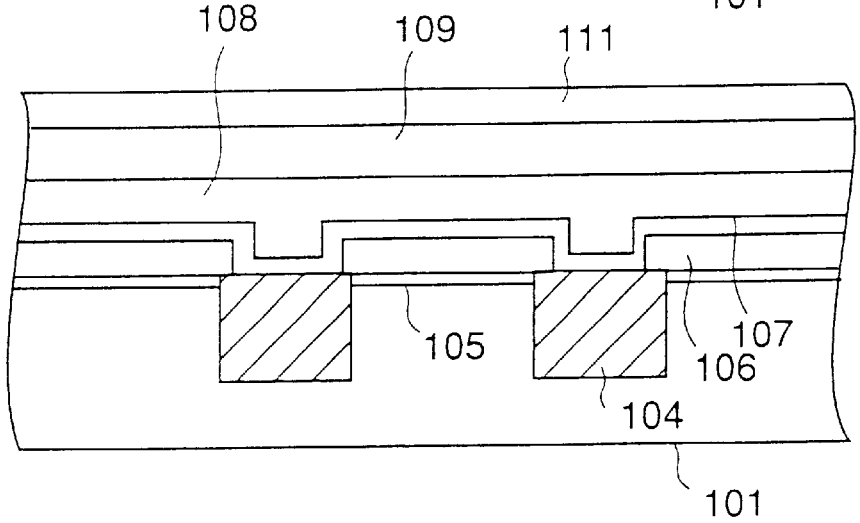

As shown in FIG. 10D, an ONO film 107 for combining capacitance of the floating gate and a control gate may be formed such that an oxide film with a thickness of approximately 10 nm is formed by means of the CVD process, a silicon nitride film with a thickness of approximately 10 nm is stacked on the an oxide film, and an oxide film with a thickness of approximately 4 nm is further stacked on the silicon nitride film by means of the thermal oxidation process which may be performed at 950° C. for example.

After that, on the ONO film 107, a polysilicon film 108 with a thickness of approximately 120 nm is stacked as the control gate by means of the CVD process. The polysilicon film 108 is doped with the phosphorus until resistivity thereof reaches to approximately 60 Ω/cm. In addition, at this time, the amorphous silicon film, which is doped by phosphorus, may be used instead of the polysilicon film 108.

On the polysilicon film 108, a WSi film 109 with a thickness of approximately 150 nm is stacked. And on the WSi film 109, a silicon nitride oxide film 111 with a thickness of approximately 100 nm is further stacked. The silicon nitride oxide film 111 serves as an anti-reflection film in exposure at the time of resist patterning.

Figure 11A:
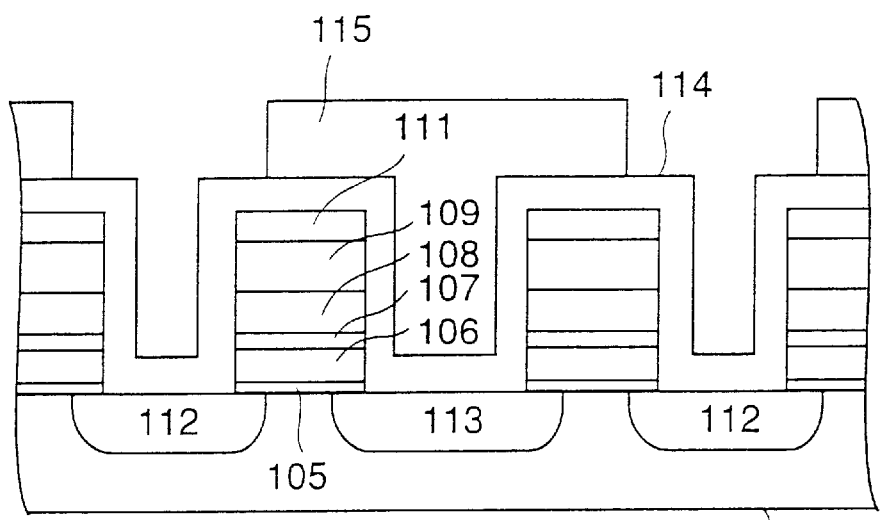
FIGS. 11A through 11C are diagrams showing a cross-sectional configuration of the semiconductor memory device of the first embodiment, taken along a line D–D' of FIG. 9.
Figure 11B:
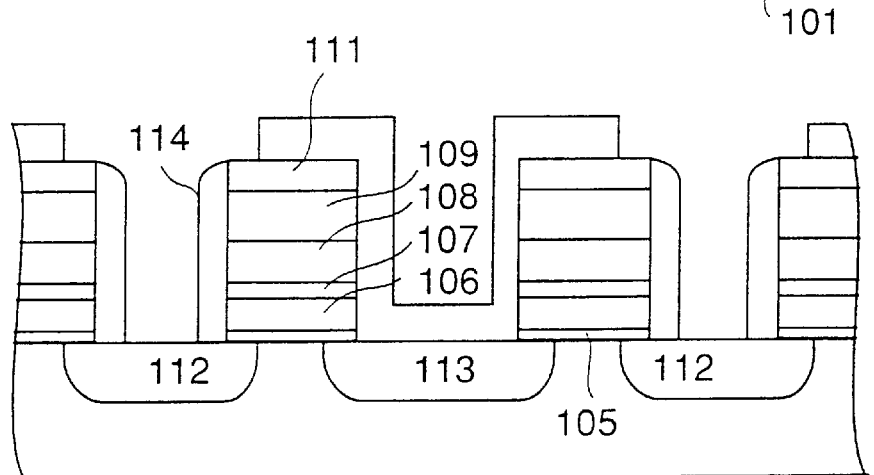
Figure 11C:
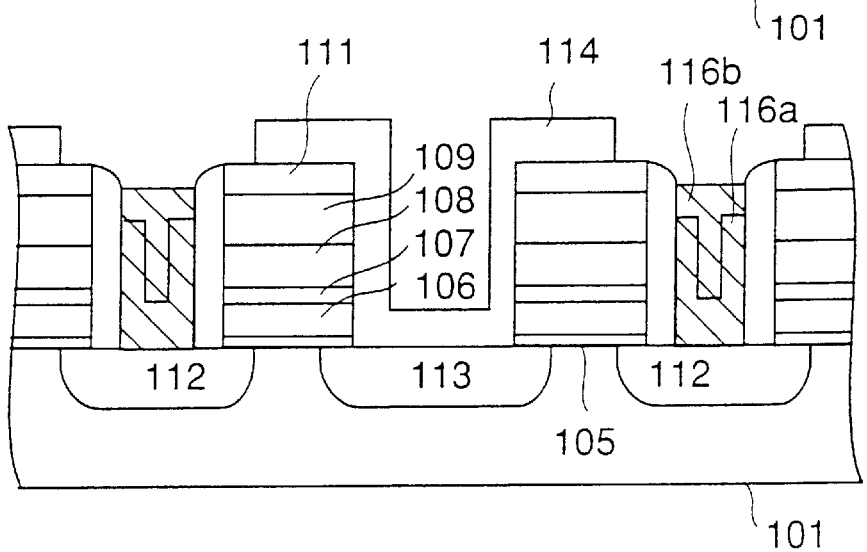

FIGS. 11A through 11C, on the other hand, are cross-sectional diagrams showing a configuration of the semiconductor memory device of the first embodiment, taken along a line D–D' in the bit line BL of FIG. 9.

As shown in FIG. 11A, resist (not shown) in a pattern extending in a direction intersecting a pattern of the trench element isolation region 104 shown in FIG. 9 is applied thereon. Then, the silicon nitride oxide film 111, the WSi film 109, and the polysilicon film 108 are etched in order by using the resist as a mask.

Thereby, the word line WL connected to the control gates of the semiconductor memory cells MC is thus formed. After that, a stacked gate electrode is formed by using the silicon nitride oxide film 111 as a mask to etch the ONO film 107 and the polysilicon film 106.

Then, by performing a self-aligned ion implantation for the stacked gate, impurities are implanted into the silicon semiconductor substrate 101, and the thermal process is performed half an hour in a nitrogen atmosphere of, for example, approximately 900° C. Thereby, a source diffusion region 112 and a drain diffusion region 113 are thus formed. In addition, the above-mentioned ion implantation is performed such that, for example, $AS^+$ ions are accelerated with the energy of 60 KeV and then irradiated into the silicon semiconductor substrate 101 by a dose of $4 \times 10^{15}$ ions/cm$^2$.

It should be noted that a width of the drain diffusion region 113 in a direction along the trench element isolation region 104 is equal to or broader than that of the source diffusion region 112.

Then, on the silicon nitride oxide film 11, a silicon oxide film 114 with a thickness of approximately 100 nm is stacked by means of the CVD process, and the source diffusion region 112 is exposed by means of the lithography technique. Therefore, resist 115 covering the drain diffusion region 113 is patterned. In addition, it can be also considered that a nitride film may be stacked instead of the silicon oxide film 114.

As shown in FIG. 11B, by performing anisotropy etching and removing the resist 115, the silicon oxide film 114 is formed as a side wall spacer on the source diffusion region 112 by means of the self-aligned process. In addition, at this time, the silicon nitride oxide film 11 serves as an etching stopper.

As shown in FIG. 11C, a conductive polysilicon film 116a with a thickness of approximately 120 nm and a conductive WSi film 116b with a thickness of approximately 15 nm are stacked on the source diffusion region 112. And then, by means of the lithography and etching techniques, the resist 115 is patterned and etched so that the source line SL can be formed as shown in FIG. 9. Since the side wall spacer formed by the silicon oxide film 114 serves as an insulation film, the word line WL and the source line SL are electrically insulated from each other.

In addition, it goes without saying that a metal film may be used instead of the polysilicon film 116a and the WSi film 116b.

Figure 12:
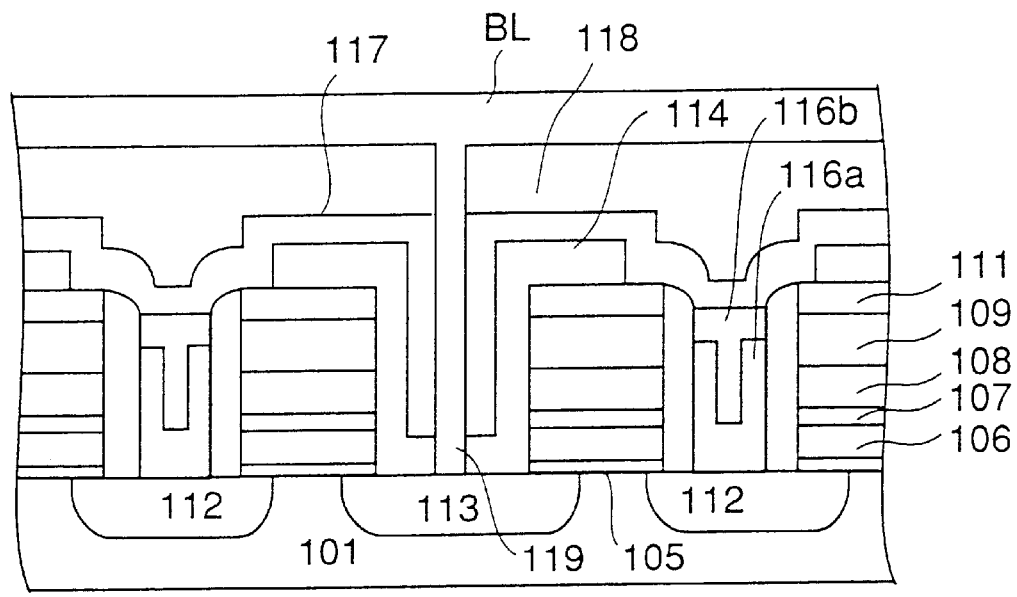
FIG. 12 is another diagram showing a cross-sectional configuration of the semiconductor memory device of the first embodiment, taken along the line D–D' of FIG. 9.

FIG. 12 is another diagram showing a cross-sectional configuration of the semiconductor memory device of the first embodiment, taken along the D–D' line of FIG. 9.

As shown in this diagram, a silicon oxide film 117 with a thickness of approximately 100 nm and a BPSG film 118 with a thickness of approximately 900 nm are stacked thereon by means of the CVD process. Then, resist (not shown) for forming a contact hole 119 is applied thereon and then is patterned and etched so that the contact hole 119 can be formed.

After that, aluminum films are stacked thereon by means of a spattering process and is patterned into the bit line BL.

Figure 13:
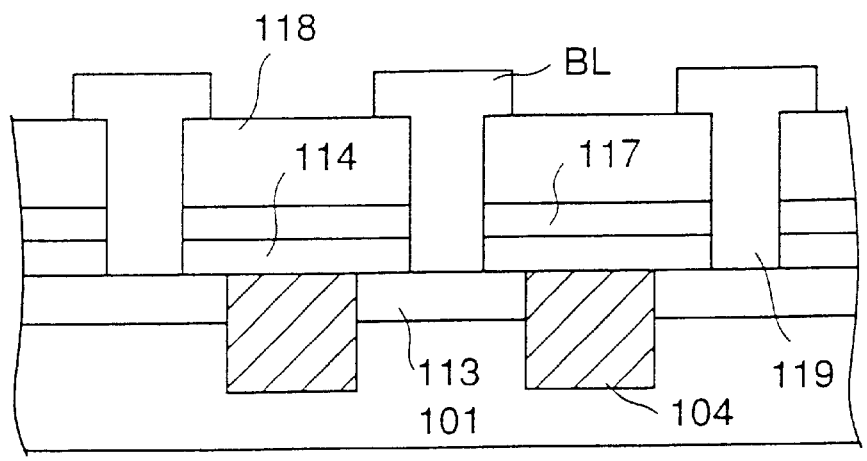
FIG. 13 is a diagram showing a cross-sectional configuration of the semiconductor memory device of the first embodiment, taken along a line B–B' of FIG. 9.

FIG. 13 is a diagram showing a cross-sectional configuration of the semiconductor memory device of the first embodiment, taken along a line B–B' of FIG. 9.

As shown in this diagram, the trench element isolation region 104 and the drain diffusion region 113 are stacked on the silicon semiconductor substrate 101. The silicon oxide films 114, 117 and the BPSG film 118 are further stacked on the trench element isolation region 104 and the drain diffusion region 112. After that, the contact hole 119 is opened, and thereby the aluminum wiring film is formed as the bit line BL.

Figure 14:
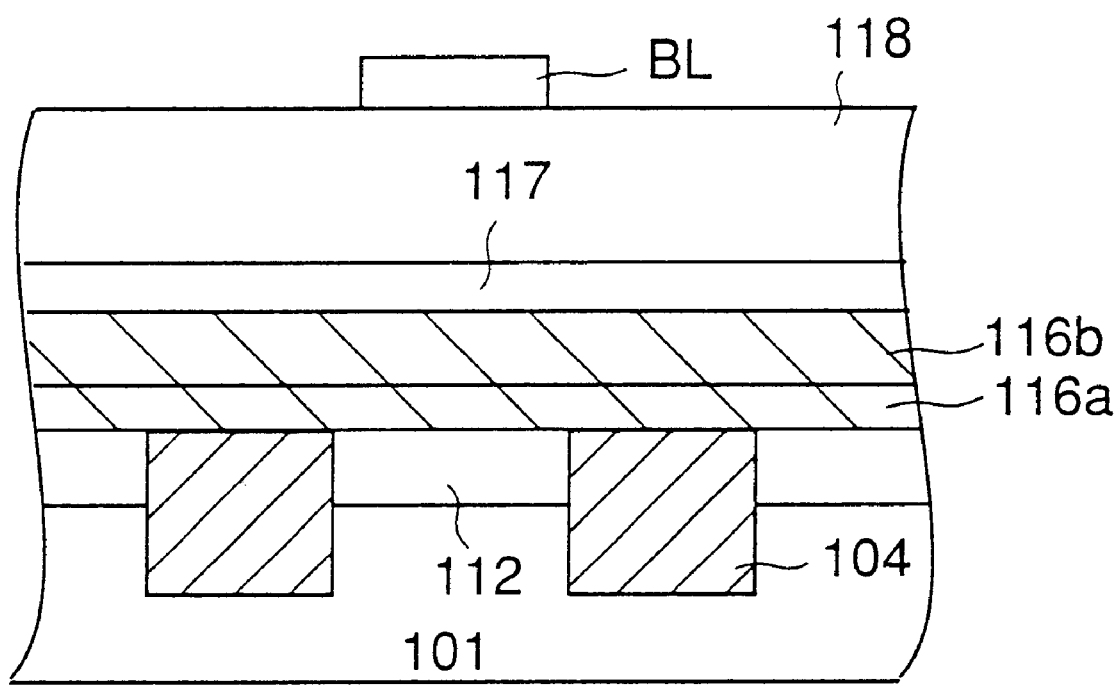
FIG. 14 is a diagram showing a cross-sectional configuration of the semiconductor memory device of the first embodiment, taken along a line C–C' of FIG. 9.

FIG. 14 is a diagram showing a cross-sectional configuration of the semiconductor memory device of the first embodiment, taken along a line C–C' of FIG. 9.

As shown in this diagram, the trench element isolation region 104 and the source diffusion region 112 are flat formed on the silicon semiconductor substrate 101. The polysilicon film 116a and the WSi film 116b are stacked on the trench element isolation region 104 and the source diffusion region 112. Further, the silicon oxide film 117 and the BPSG film 118 are stacked on the WSi film 116b. Thus, the bit line BL is formed.

In addition, after the above described processes are completed, the metal wiring is performed, which is the same as that of the common MOS integrated circuit, and then a surface protecting insulation film is formed thereon. Thus, the semiconductor memory device of the first embodiment is manufactured.

Next, a description will be given below of a semiconductor memory device according to a second embodiment of the present invention, by referring to FIGS. 10A through 10D, FIG. 16 and FIG. 17.

As shown in FIG. 10A, on the silicon semiconductor substrate 101, the pad oxide film 102 with a thickness of approximately 25 nm is formed by means of the thermal oxidation process performed at, for example, 900° C. On the pad oxide film 102, the silicon nitride film 103 with a thickness of approximately 170 nm is stacked by means of the Chemical Vapor Deposition (CVD) process. And then, by using lithography and etching techniques, the silicon nitride film 103 is patterned and etched so as to remain on element regions alone.

As shown in FIG. 10B, the silicon semiconductor substrate 101 is etched to form a plurality of trenches with a depth of approximately 400 nm by means of the silicon nitride film 103 used as a mask, and the etched trenches are stacked with an oxide film having a thickness of approximately 1000 nm by means of the CVD process. Then, the oxide film has its surface polished by means of the Chemical Mechanical Polish (CMP) process so as to be buried in the etched trenches to form the trench element isolation regions 104. After that, the silicon nitride film 103 and the pad oxide film 102 are removed therefrom.

As shown in FIG. 10C, the tunnel insulation film 105 with a thickness of approximately 10 nm is formed on the silicon semiconductor substrate 101 by means of the thermal oxidation process. After that, the polysilicon film 106 with a thickness of approximately 100 nm is stacked as a floating gate on the tunnel insulation film 105 by means of the CVD process. And then, the polysilicon film 106 is doped with the phosphorus until resistivity thereof reaches to approximately 300 $\Omega$/cm. In addition, at this time, the amorphous silicon film, which is phosphorus-doped, may be used instead of the polysilicon film 106.

Next, by employing the lithography and etching techniques, the polysilicon film 106 is patterned into a stripped pattern so as to cover the element forming regions.

As shown in FIG. 10D, the ONO film 107 for combining capacitance of the floating gate and the control gate may be formed such that an oxide film with a thickness of approximately 10 nm is formed by means of the CVD process, the silicon nitride film with a thickness of approximately 10 nm is stacked on the an oxide film, and the oxide film with a thickness of approximately 4 nm is further stacked on the silicon nitride film by means of the thermal oxidation process performed at, for example, 950° C.

After that, the polysilicon film 108 with a thickness of approximately 120 nm is stacked thereon as the control gate by means of the CVD process. The polysilicon film 108 is doped with the phosphorus until resistivity thereof reaches to approximately 60 $\Omega$/cm. In addition, at this time, the amorphous silicon film which is phosphorus-doped may be used instead of the polysilicon film 108.

On the polysilicon film 108, the WSi film 109 with a thickness of approximately 150 nm is formed. And on the WSi film 109, the silicon nitride oxide film 111 with a thickness of approximately 100 nm is formed. The silicon nitride oxide film 111 serves as the anti-reflection film in exposure at the time of the resist patterning.

Figure 16A:
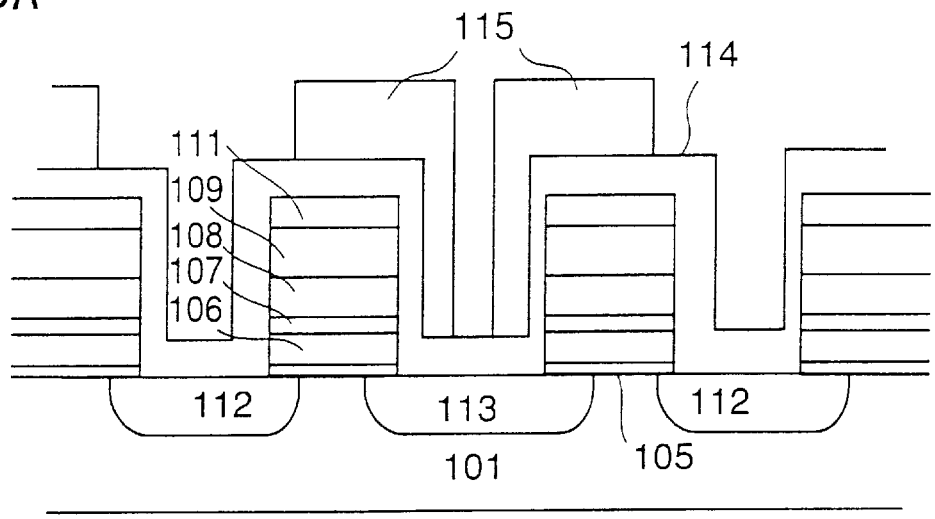
FIGS. 16A through 16C are diagrams showing a cross-sectional configuration of the semiconductor memory device of a second embodiment, taken along the line D–D' of FIG. 9.
Figure 16B:
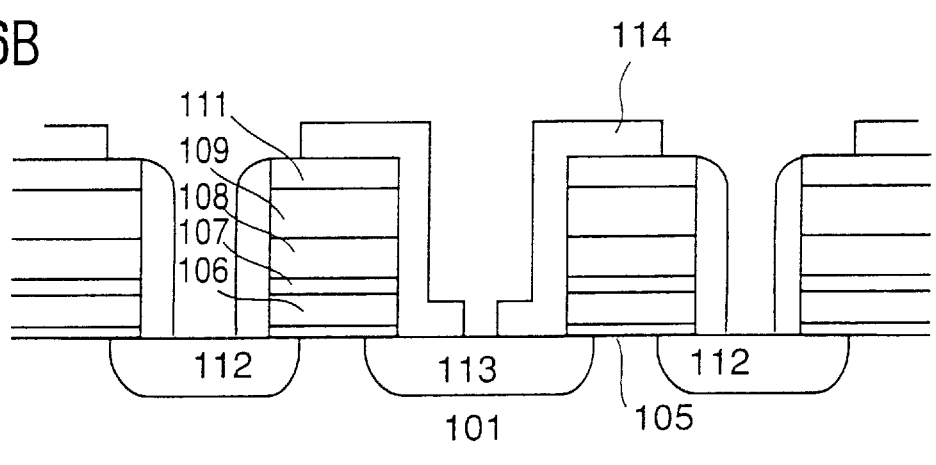
Figure 16C:
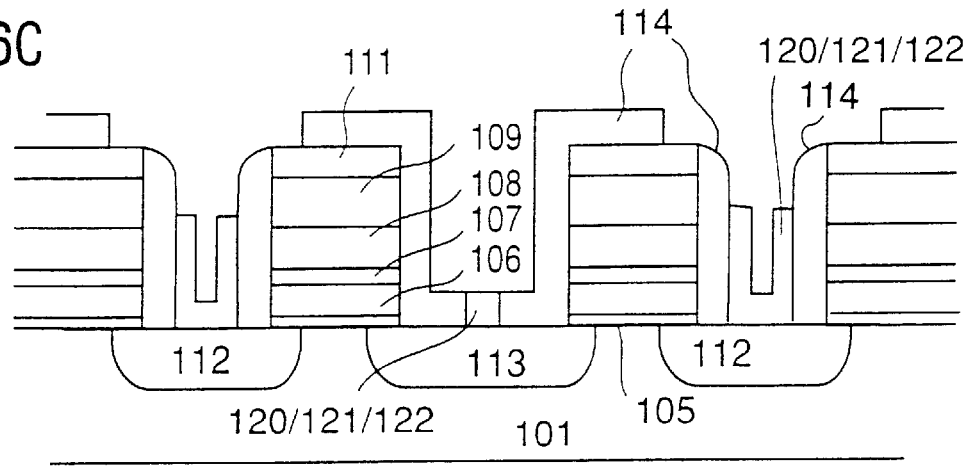

FIGS. 16A through 16C are, on the other hand, cross-sectional diagrams showing a configuration of the semiconductor memory device of the second embodiment, taken along the line D–D' in FIG. 9.

As shown in FIG. 16A, resist (not shown) in a pattern extending in a direction intersecting a pattern of the trench element isolation region 104 shown in FIG. 9 is applied thereon. The resist is used as a mask so that the silicon nitride oxide film 111, the WSi film 109, and the polysilicon film 108 are etched in order.

Thereby, the word line WL connected to the control gate of the semiconductor memory cell MC is thus formed. After that, the ONO film 107 and the polysilicon film 106 are etched by means of the silicon nitride oxide film 111 used as a mask so that the stacked gate electrode is formed.

Then, by performing the self-aligned ion implantation for the stacked gate, impurities are implanted into the silicon semiconductor substrate 101, and the thermal process is performed half an hour in the nitrogen atmosphere of, for example, approximately 900° C. Thereby, the source diffusion region 112 and the drain diffusion region 113 are formed.

In addition, the above-mentioned ion implantation is performed such that, for example, $AS^+$ ions are accelerated with the energy of 60 KeV and then are irradiated into the silicon semiconductor substrate 101 by a dose of $4 \times 10^{15}$ ions/cm$^2$.

Also, It should be noted that the width of the drain diffusion region 113 in the direction along the trench element isolation region 104 is equal to or broader than that of the source diffusion region 112.

After the silicon oxide film 114 with a thickness of approximately 100 nm is stacked by means of the CVD process, the resist 115 is patterned so as to expose the source diffusion region 112 by means of the lithography technique and to form the contact hole 119 on the drain diffusion region 113.

In addition, it is also considered that a nitride film may be stacked instead of the silicon oxide film 114.

As shown in FIG. 16B, by performing the etching process and removing the resist 115, the silicon oxide film 114 is formed as a side wall spacer on the source diffusion region 112 by means of the self-aligned process, and the contact hole 119 is formed on the drain diffusion region 113.

In addition, at this time, the silicon nitride oxide film 11 serves as the etching stopper. titanium film 120 with a thickness of about 30 nm, a nitride titanium film 121 with a thickness of about 50 nm, and a tungsten layer 122 with a thickness of approximately 400 nm are stacked on both the source diffusion region 112 and the drain diffusion region 113.

And then, by using the lithography and etching techniques, the resist is patterned and the stacked films are etched so that the source line SL is formed and the plug is buried on the drain diffusion region 113. Then, since the side wall spacer formed from the silicon oxide film 114 is the insulation film, the word line WL and the source line SL are electrically insulated from each other.

Figure 17:
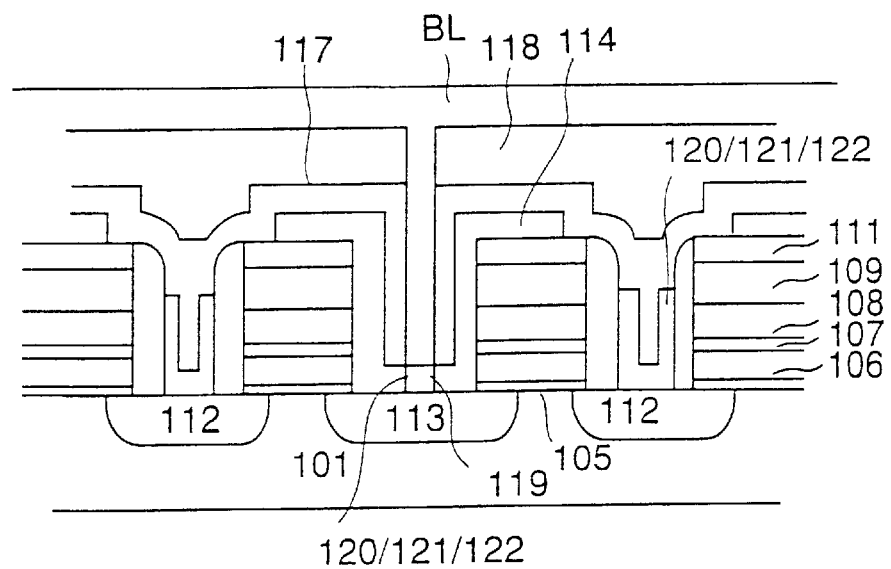
FIG. 17 is another diagram showing a cross-sectional configuration of the semiconductor memory device of the second embodiment, taken along the line D–D' of FIG. 9.

Furthermore, as shown in FIG. 17, the silicon oxide film 117 with a thickness of about 100 nm and the BPSG film 118 with a thickness of about 900 nm are stacked thereon by means of the CVD process. After that, the resist (not shown) used for forming the contact hole 119 is patterned and the above-mentioned films are etched so that the contact hole 119 can be formed as shown in FIG. 17.

Then, the aluminum films are stacked by using the spattering process and patterned so that the bit line BL is formed.

In addition, after the above described processes are completed, the metal wiring is performed in the same way as that on the common MOS integrated circuit, and then the surface protecting insulation film is formed. Finally, the semiconductor memory device of the second embodiment is thus manufactured.

Moreover, the above-mentioned silicon semiconductor substrate 101 may be the SOI semiconductor substrate. In a case of using such an SOI semiconductor substrate, the semiconductor memory device can operate with higher speed because parasitic capacitance is reduced.

Figure 18:
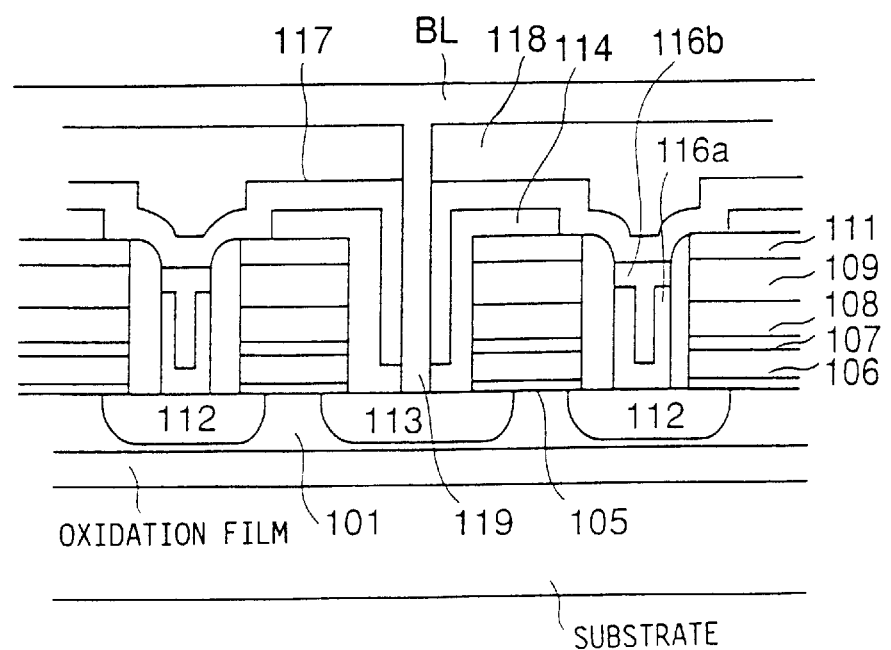
FIG. 18 is another diagram showing a cross-sectional configuration of the semiconductor memory device of the second embodiment in a case of using a SOI (silicon on insulator) semiconductor substrate, taken along the line D–D' of FIG. 9.

FIG. 18 is another diagram showing a cross-sectional configuration of the semiconductor memory device of the second embodiment in a case of using the SOI semiconductor substrate, taken along the line D–D' of FIG. 9.

Figure 15:
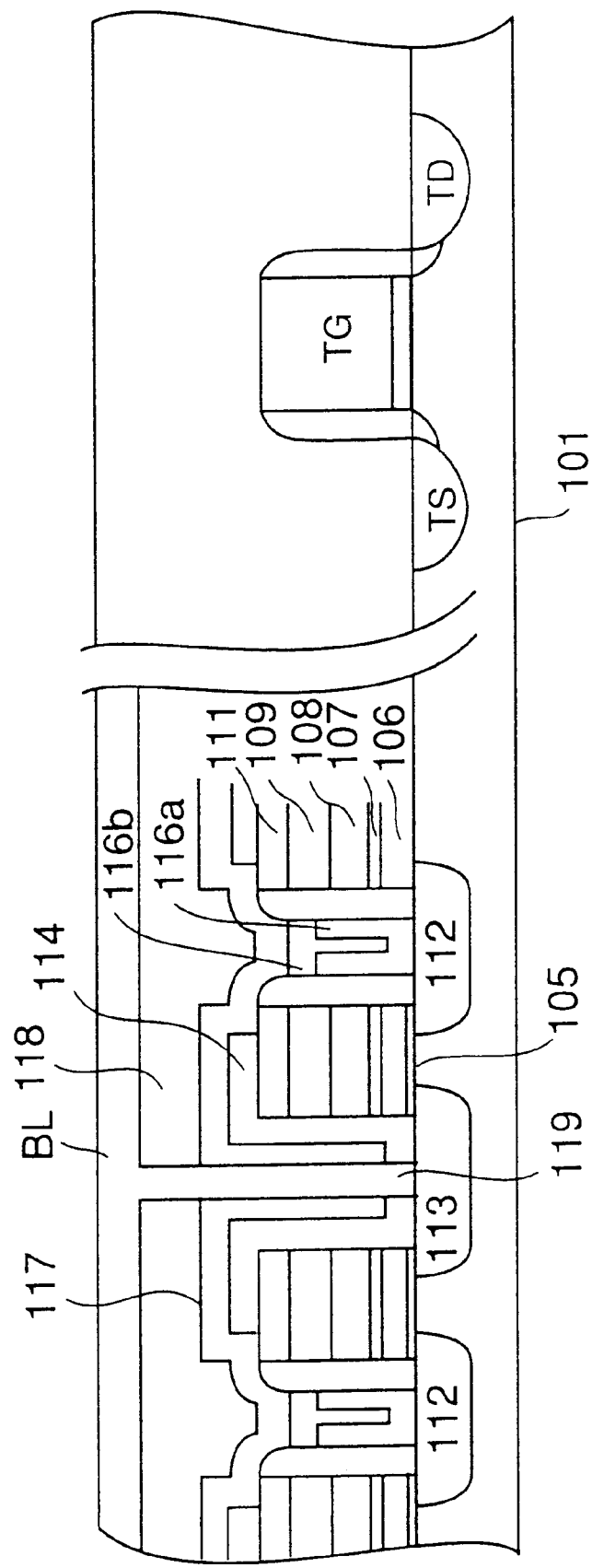
FIG. 15 is a diagram showing a cross-sectional configuration of the semiconductor memory device of the first embodiment, in a case where a transistor and the NOR flash memory cells are formed on one silicon semiconductor substrate thereof.

The previously described configuration can improve performance of the semiconductor memory device in accordance with the present invention, where logic circuits can be provided on the silicon semiconductor substrate 101. FIG. 15 is a diagram showing a cross-sectional configuration of the semiconductor memory device in accordance with the present invention. As shown in this diagram, the NOR flash memory cell in accordance with the present invention is provided on the silicon semiconductor substrate 101, as well as a transistor including a gate TG, a source diffusion region TS and a drain diffusion region TD.

As previously described, according to the method for manufacturing the semiconductor memory device in accordance with the present invention, the NOR flash memory can be easily manufactured even in the case of employing the trench element isolation process.

Further, the semiconductor memory device including the NOR flash memory cells with high density can be obtained by the method of the present invention.

The above description is provided in order to enable any person skilled in the art to make and use the invention and sets forth the best mode contemplated by the inventor for carrying out their invention.

Although the present invention has been described in terms of various embodiments, it is not intended that the invention be limited to these embodiments. Modification within the spirit of the invention will be apparent to those skilled in the art.

The present application is based on Japanese priority application No. 11-215601 filed on Jul. 29, 1999, the entire contents of which are hereby incorporated by reference.

What is claimed is:

1. A semiconductor memory device comprising:
    a semiconductor substrate;
    a plurality of memory cells arranged on said semiconductor substrate in an array which is made up of a plurality of rows and columns, each of said memory cells having a gate, a drain, and a source;
    a plurality of word lines, each coupled to gates of the memory cells in a corresponding row;
    a plurality of bit lines, each coupled to drains of the memory cells in a corresponding column;
    a plurality of isolation regions formed on said semiconductor substrate and including trench element isolation regions isolating the memory cells; and
    a plurality of source lines, disposed approximately parallel to said word lines, and each coupled to sources of the memory cells in a corresponding row;
    wherein each of said source lines is made up of a conductive pattern formed on an approximately flat region of said semiconductor substrate.

2. The semiconductor memory device as claimed in claim 1, wherein:
    said source is formed from a source diffusion region;
    said drain is formed from a drain diffusion region formed between said isolation regions and positioned on the opposite side of said gate to said source; and
    said drain diffusion region has a width along said isolation regions, said width being equal to a width of said source diffusion region.

3. The semiconductor memory device as claimed in claim 1,
    wherein said source is formed from a source diffusion region,
    wherein said drain is formed from a drain diffusion region formed between said isolation regions and positioned on the opposite side of said gate to said source, and
    wherein said drain diffusion region has a width along said isolation regions, said width being broader than a width of said source diffusion region.

4. The semiconductor memory device as claimed in claim 1, wherein said semiconductor memory cells are non-volatile semiconductor memory cells.

5. The semiconductor memory device as claimed in claim 4, wherein said non-volatile semiconductor memory cells are NOR-type flash memory cells.

6. The semiconductor memory device as claimed in claim 1, wherein said conductive pattern is integrally formed for said source line.

7. The semiconductor memory device as claimed in claim 1, wherein said conductive pattern is formed between side walls of the adjacent gates of said semiconductor memory cells.

8. The semiconductor memory device as claimed in claim 4, wherein each of said non-volatile semiconductor memory cells includes:
    a tunnel insulation film formed on said semiconductor substrate;
    a floating gate formed on said tunnel insulation film;
    a control gate formed on said floating gate; and
    a nitride film formed on said control gate.

9. The semiconductor memory device as claimed in claim 8, wherein said floating gate and said control gate are made up of polysilicon doped with phosphorus or amorphous silicon.

10. The semiconductor memory device as claimed in claim 1, wherein said semiconductor substrate is an SOI semiconductor substrate.

11. The semiconductor memory device as claimed in claim 1, further comprising a logic circuit formed on said semiconductor substrate.

12. The semiconductor memory device as claimed in claim 1, wherein said source line is made up of a metal or silicide.

* * * * *